(12) United States Patent
Ruile et al.

(10) Patent No.: US 10,224,897 B2
(45) Date of Patent: Mar. 5, 2019

(54) MICRO-ACOUSTIC COMPONENT HAVING IMPROVED TEMPERATURE COMPENSATION

(71) Applicant: Snaptrack Inc., San Diego, CA (US)

(72) Inventors: Werner Ruile, München (DE); Philipp Michael Jäger, München (DE); Matthias Knapp, München (DE)

(73) Assignee: SnapTrack, Inc., San Diego, CA (US)

( * ) Notice: Subject to any disclaimer, the term of this patent is extended or adjusted under 35 U.S.C. 154(b) by 139 days.

(21) Appl. No.: 15/314,790

(22) PCT Filed: Jul. 9, 2015

(86) PCT No.: PCT/EP2015/065728
§ 371 (c)(1),
(2) Date: Nov. 29, 2016

(87) PCT Pub. No.: WO2016/026612
PCT Pub. Date: Feb. 25, 2016

(65) Prior Publication Data
US 2017/0194932 A1    Jul. 6, 2017

(30) Foreign Application Priority Data
Aug. 21, 2014  (DE) .................. 10 2014 111 993

(51) Int. Cl.
*H03H 9/02*       (2006.01)
*H03H 9/145*      (2006.01)
*H03H 9/46*       (2006.01)

(52) U.S. Cl.
CPC .... *H03H 9/02834* (2013.01); *H03H 9/02102* (2013.01); *H03H 9/14544* (2013.01); *H03H 9/462* (2013.01)

(58) Field of Classification Search
CPC .......... H03H 9/02834; H03H 9/02102; H03H 9/14544
See application file for complete search history.

(56) References Cited

U.S. PATENT DOCUMENTS

| 3,965,444 A | 6/1976 | Willingham et al. |
| 7,589,452 B2 | 9/2009 | Hauser et al. |
| 2015/0318837 A1* | 11/2015 | Zou ................... H03H 9/02102 333/187 |

FOREIGN PATENT DOCUMENTS

| JP | 08-181562 A | 7/1996 |
| JP | 2000196410 A | 7/2000 |
| JP | 2006033748 A | 2/2006 |

(Continued)

OTHER PUBLICATIONS

International Search Report corresponding to Application No. PCT/EP2015/065728, European Patent Office, dated Oct. 16, 2015; (3 pages).

(Continued)

*Primary Examiner* — Derek Rosenau
(74) *Attorney, Agent, or Firm* — Patterson & Sheridan, L.L.P.

(57) ABSTRACT

For a component operating with acoustic waves, it is proposed to provide a compensation layer on the component for compensating for a negative temperature coefficient of the frequency, which includes a material based on a chemical compound made up of at least two elements, which has a negative thermal expansion coefficient.

19 Claims, 3 Drawing Sheets

(56) References Cited

FOREIGN PATENT DOCUMENTS

| | | |
|---|---|---|
| JP | 2007510386 A | 4/2007 |
| JP | 2008118576 A | 5/2008 |
| JP | 2008125130 A | 5/2008 |
| JP | 2014027639 A | 2/2014 |
| WO | 2005/043756 A1 | 5/2005 |
| WO | 2014086524 A2 | 6/2014 |

OTHER PUBLICATIONS

Cora Lind: "Two Decades of Negative Thermal Expansion Research: Where do we stand?" Jun. 20, 2012, pp. 1125-1154, XP 055219453.
Fukazawa et. al.: "Picosecond Ultrasound for Studying Anomalous Temperature Dependence of Elastic Constants of the Negative-Expansion Zirconium Tungstate" Proceedings of Symposium on Ultrasonic Electronics, vol. 35, pp. 19-20, Dec. 3-5, 2014.
Morelock, Cody R. et al.:"Negative thermal expansion and compressibility of $Sc_{1-x}Y_xF_3$ . . . " Journal of Applied Physics 114, 213501 (2013); (8 pages).

\* cited by examiner

MICRO-ACOUSTIC COMPONENT HAVING IMPROVED TEMPERATURE COMPENSATION

CROSS-REFERENCE TO RELATED APPLICATIONS

This application is a U.S. National Stage of International Application No. PCT/EP2015/065728, filed on Jul. 9, 2015, which claims the benefit of Germany Patent Application No. 10 2014 111 993.2, filed on Aug. 21, 2014, both of which are incorporated herein by reference in their entireties.

The properties of components operating with acoustic waves, for example, SAW (surface acoustic wave) components or BAW (bulk acoustic wave) components, generally demonstrate a dependence on temperature. Thus, for example, the temperature coefficient of the center frequency (TCF) of SAW components based on lithium tantalate (LT 42° rot xy) is typically at, for example, −40 ppm/K. Different substrates demonstrate different temperature coefficients.

The thermal expansion of these materials also results in a reduction of the density ρ, and has a direct influence on the wave velocity v via the relationship $$v=\sqrt{(c/\rho)}$$

As a result, the increased running length for the wave due to the thermal expansion is compensated for. However, above all, the fact that the rigidity c also changes with temperature, decreasing with increasing temperature in most materials and thus also in the piezoelectric material, has a major influence on the frequency. Furthermore, the piezoelectric tensor and the permittivity of the substrate are also temperature-dependent and thus contribute to the temperature coefficient. The change in rigidity of the electrode materials also has an influence on the TCF.

The problem thereby results that production tolerances in components operating with acoustic waves become narrower in order, for example, to increase the bandwidths of filters around the temperature-dependent fluctuations. In the case of closely adjacent frequency bands, this impedes the selectivity or results in a higher proportion of components during production which no longer meet the required specifications. It is no longer possible to meet other specifications without measures for compensating for the TCF.

U.S. Pat. No. 7,589,452 B2 proposes a component operating with acoustic waves, which combines different measures for reducing the temperature drift (temperature coefficient compensation), in particular of the resonance frequency. The component includes electrically conductive component structures on the upper side of the substrate, and a compensation layer on the lower side which is connected to the substrate in a mechanically fixed manner in such a way that a mechanical stress results or builds up in the case of a change in temperature.

As a further measure, a $SiO_2$ layer is arranged above the component structures, which has a positive temperature coefficient of its thermoelastic properties, which compensates for the negative temperature coefficients of most substrate materials, for example, LT or LN (lithium niobate).

This approach is disadvantageous in that the required reflectivity of the electrodes is maintained only via heavy electrodes. This is unsatisfactory in particular for SAW components and is insufficient for some applications. Furthermore, temperature compensation with $SiO_2$ is disadvantageous in that its temperature compensation property is limited, and due to the use of $SiO_2$, a loss of electromechanical coupling and bandwidth, increased attenuation, and the occurrence of undesirable spurious modes must be accepted. This limits the effectively achievable temperature coefficient compensation.

Other layers having a positive temperature coefficient, such as $GeO_2$ and fluorine-doped or boron-doped $SiO_2$, have already been proposed for compensating for the temperature-dependent properties.

The object of the present invention is to provide new options or new materials for compensating for the temperature coefficient, via which the compensation is improved and the associated disadvantages are also reduced.

This object is achieved according to the present invention by a component having the features according to claim 1. Advantageous embodiments of the present invention may be found in the subclaims.

The present invention is based on the finding that among the materials having a negative thermal expansion coefficient, many materials may be found which have a positive temperature coefficient of their thermomechanical properties. Such materials may be used for compensating for a negative temperature coefficient of the thermomechanical properties, as generally occurs with piezoelectric materials.

It is proposed to apply a compensation layer to a component operating with acoustic waves which includes a dielectric material based on a chemical compound made up of at least two elements, which has a negative thermal expansion coefficient.

According to one embodiment, the chemical compound is an inorganic transition metal compound or a rare-earth compound. However, compounds of other substance classes are also suitable.

Such a component includes at least one layer of a piezoelectric material including an electrode pair for exciting acoustic waves in the piezoelectric material. The compensation layer is arranged on this component in such a way that at least a portion of the energy of the acoustic wave is located in the compensation layer. This requires a relative proximity to the piezoelectric layer in which the acoustic wave is primarily generated.

Materials having negative thermal expansion coefficients which are selected, for example, from the class of dielectric inorganic transition metal and rare-earth compounds, surprisingly demonstrate a high positive temperature coefficient of their modulus of elasticity, i.e., an increase in rigidity with increasing temperature, which is greater than the best materials known to date, for example, $SiO_2$, which has been used for this purpose up to now. This high change in rigidity and the associated positive temperature coefficient of the modulus of elasticity makes it possible to achieve a more effective compensation layer.

Thus, it is furthermore possible to completely compensate for temperature coefficients of the frequency, and in addition, by means of a compensation layer having a lower thickness than the materials known to date. A thinner compensation layer simultaneously reduces the problems of the compensation layers known to date. In particular, the disadvantageous effects, such as the reduction of the piezoelectric coupling and the acoustic attenuation which must be taken into account with the compensation layer, are smaller.

An additional advantage of the discovered compound class is that the compounds may generally be applied in a controlled manner using conventional deposition methods known from semiconductor technology. Thus, they are also highly suitable in terms of process engineering for being applied to a component operating with acoustic waves.

In one embodiment of the present invention, the compensation layer is applied directly to the layer of the piezoelectric material. The electrodes and the compensation layer may be arranged on the same side of the piezoelectric layer. However, it is also possible to arrange the compensation layer below the piezoelectric layer and to arrange the electrodes above the piezoelectric layer. Furthermore, it is possible to provide the electrodes between the piezoelectric layer and the compensation layer. An additional possible variant in principle is to apply the electrodes to the compensation layer, which in turn is deposited on the piezoelectric layer.

In one preferred embodiment of the present invention, the compensation layer includes a rare-earth compound having negative thermal expansion coefficients in the form of a glass which is based on scandium trifluoride $ScF_3$. This material is sufficiently hard, mechanically stable, and is very easy to deposit.

An especially high positive temperature coefficient of the modulus of elasticity may be achieved by means of an yttrium-doped scandium trifluoride having the formula $Sc_{(1-x)}Y_xF_3$, where the yttrium component expressed by the coefficient x is set ≤0.25, so that the relationship $0<x≤0.25$ applies.

The yttrium content of this compound is limited by the solubility of yttrium trifluoride in the scandium trifluoride and may theoretically also be higher if it is possible to produce corresponding materials.

An yttrium-doped scandium trifluoride having an yttrium content of approximately 20%, i.e., in which x=0.2, demonstrates particularly positive and advantageous properties. In pure form, this material demonstrates a temperature coefficient of the modulus of elasticity of approximately 1500 ppm/K. This temperature coefficient is more than five times higher than that of undoped $SiO_2$, which is currently used in components as a compensation layer. In comparison to fluorine-doped $SiO_2$, which has only been proposed to date, but not yet used at all, the temperature coefficient of the proposed yttrium-doped scandium trifluoride is more than twice as high. For a compensation layer produced from it, this means that the same compensation effect is achieved via a layer thickness which is only half as high as was previously the case with known compensation materials.

According to one preferred embodiment, the compensation layer has a temperature coefficient of the thermoelastic properties of >700 ppm/K. These values are achieved by various ones of the aforementioned materials having negative thermal expansion coefficients.

Via the proposed compounds, compensation layers having a temperature coefficient of the thermoelastic properties of >1000 ppm/K may also be obtained.

The aforementioned material may be present in solid pure form, in doped form, as a mixed compound along with other oxides, halides, or other crystalline compounds, or it may be embedded in solid form in a crystalline matrix or preferably in a glass. It is possible that a compensation layer which does not contain the material having a negative expansion coefficient in pure form achieves a lower compensation effect than a compensation layer which is made up exclusively of the aforementioned material. However, it is also possible that a layered mixture or a layered doping actually increases the desired effect. Mixtures with other substances or embedding into a matrix may be advantageous in the cases in which the modification of the material is not directly suitable for layer deposition, or if layers thus created are mechanically and structurally unsuitable for remaining on the component.

The term layer formation refers to a layer which is suitable for a component, having a sufficient hardness and a suitable physical consistency.

In one embodiment, the component is designed as an SAW component, i.e., as a component operating with acoustic surface waves. It includes at least one interdigital transducer on the piezoelectric layer. A compensation layer is deposited on the piezoelectric layer and above the interdigital transducer, which contains scandium trifluoride $ScF_3$, either doped (for example, with $YF_3$), as a mixed crystal with other oxides or halides, or embedded in a crystalline matrix or in a glass. With respect to the selection of the compensating material and with respect to its component in the compensation layer, the compensation layer is formed in such a way that the temperature coefficient of the center frequency, i.e., the significant temperature-dependent value for the SAW component, is already completely compensated for at a relative layer thickness of 5 to 15%. In this case, the relative layer thickness relates to the wavelength of an acoustic wave capable of propagation in this material, and specifies the layer thickness as a percentage of the wavelength.

There are also problems which require an overcompensation for the temperature coefficient, so that a higher layer thickness of the compensation layer may also be set. In this case, the relative layer thickness relates to the ratio of the layer thickness to the wavelength of the acoustic wave capable of propagation in the material, at the center frequency of the component. The layer thickness of such a compensation layer according to the present invention is less than that of the conventional compensation layers. However, a complete compensation for the temperature coefficient of the center frequency may be achieved.

The component may also be designed as a BAW component, wherein both possible embodiments are possible in the form of an SMR (solidly mounted resonator), or based on resonators arranged above membranes. Furthermore, the component may be designed as a GBAW component (including a component operating with guided bulk waves).

The components may include an electrode material which comprises one or multiple materials made up of known metals and alloys, semiconductors, as well as conductive borides, nitrides, carbides, and mixed compounds.

The components according to the present invention may be provided or designed for a wide variety of applications. For example, a use of the components according to the present invention as a resonator, DMS filter, or ladder-type filter is possible.

In an additional embodiment, the compensation layer includes a material made up of oxidic network formers. These particular network formers demonstrate a negative thermal expansion coefficient, which is usually also accompanied by an abnormal pressure behavior ("pressure softening"). Such compounds also demonstrate an abnormal thermomechanical behavior, which is also accompanied by a positive temperature coefficient of the rigidity c and the modulus of elasticity.

The isostructural tungstates $ZrW_2O_8$ and $HfW_2O_8$ are in particular known for their particularly highly abnormal thermomechanical behavior and their positive temperature coefficient of the rigidity c and the modulus of elasticity. The abnormal thermomechanical behavior of the elastic constants for $ZrW_2O_8$ has already been established.

Additional examples of oxidic network formers having a negative thermal expansion coefficient include $ZrMo_2O_8$, $HfMo_2O_8$, $ScW_3O_{12}$, $AlW_3O_{12}$, and $Zr(WO_4)(PO_4)_2$.

Materials having a negative thermal expansion coefficient are also known from other substance classes, for example, many zeolites or $B_2O_3$.

Non-oxidic network formers or glass formers, which have properties comparable to those mentioned above, include fluoride-based compounds $ScF_3$—$BaF_2$—$YF_3$, $ScF_3$—$BaF_2$—$ZnF_2$, $ScF_3$—$BaF_2$—$InF_3$, $ScF_3$—$MgF_2$, $YbF_3$—$ScF_3$, $LuF_3$—$ScF_3$, $Zn(CN)_2$, and $BeF_2$, as well as some cyanides, for example, $Zn(CN)_2$. All these compounds have negative temperature coefficients of thermal expansion and are therefore in principle also suitable for use in compensation layers on components operating with acoustic waves. In contrast, typical glass formers such as $SiO_2$, $GeO_2$, $B_2O_3$ etc. demonstrate PTE (positive thermal expansion) behavior, even if only minor.

The present invention will be described in greater detail below based on exemplary embodiments and the associated figures. The figures have merely been drawn schematically, and serve only for better understanding of the present invention. The figures are therefore in particular not true to scale, since individual portions may be depicted enlarged or reduced. Accordingly, neither relative nor absolute dimensions are to be derived from the figures.

FIGS. 1 and 2 each show a schematic cross section of an SAW component including a compensation layer in a different arrangement in each case;

Figure 7A:
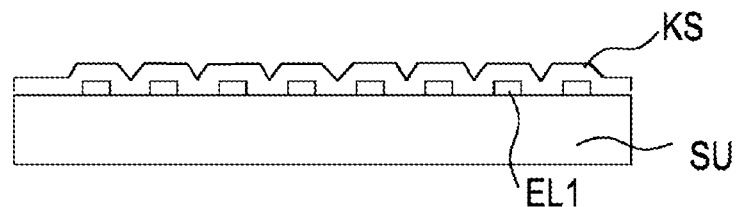
Figure 7B:
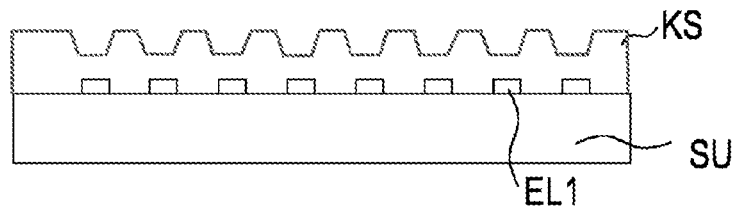
Figure 8A:
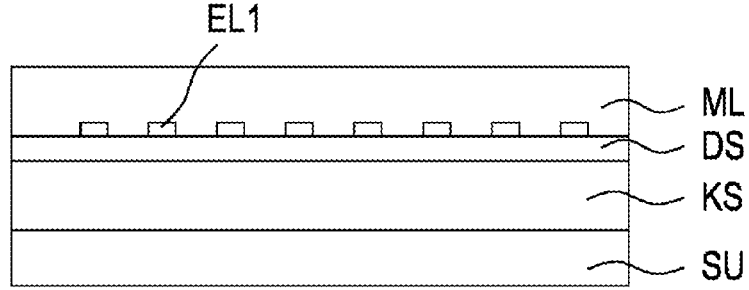
Figure 8B:
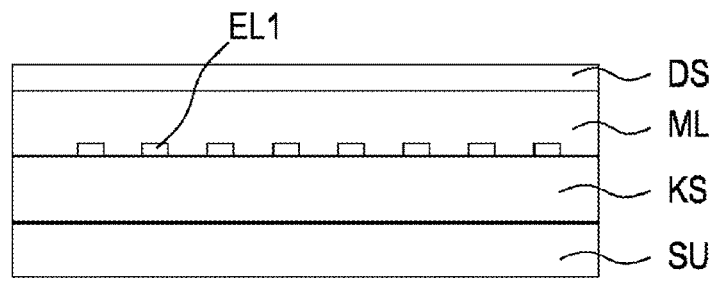
Figure 8C:
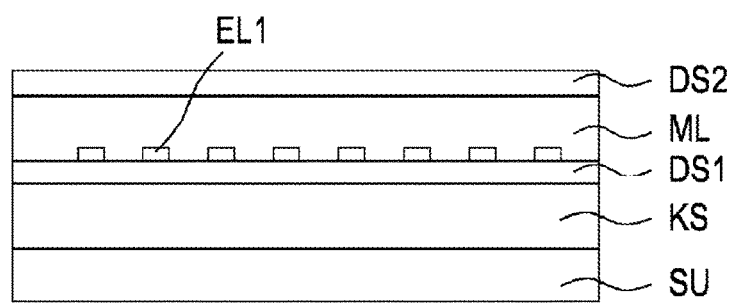
Figure 9:
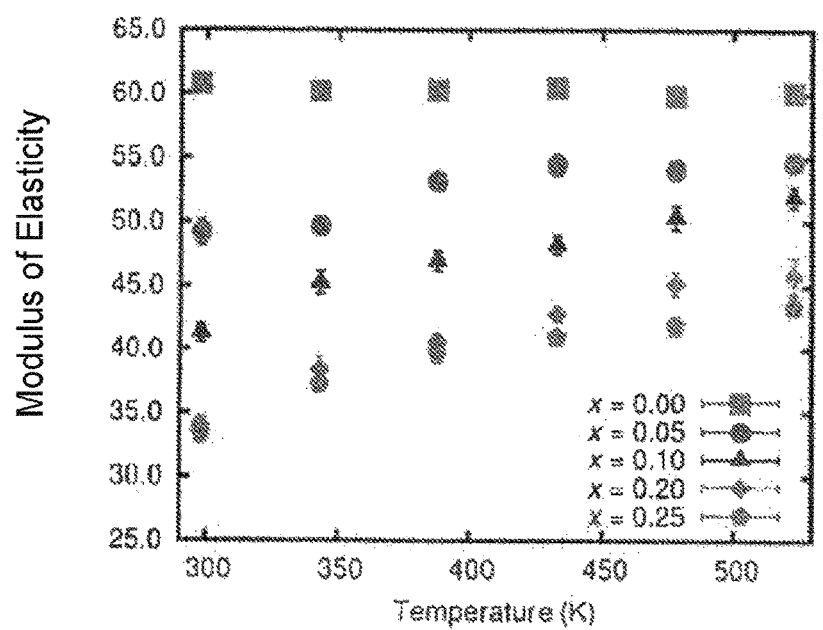

FIGS. 7a and 7b each show an SAW component having a structured compensation layer;

FIGS. 8a to 8c show SAW or GBAW components which have one or multiple additional dielectric layers DS;

FIG. 9 shows the profile of the modulus of elasticity as a function of the temperature in the system $Sc_{(1-x)}Y_xF_3$ having different yttrium content levels x.

Figure 1:
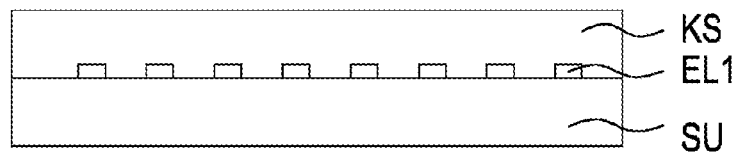

FIG. 1 shows the simplest embodiment of an SAW component provided with a compensation layer KS. A first electrode layer EL1, which is designed in the form of comb electrodes which are intermeshed in a comb-like manner, is arranged on a substrate which includes at least one thin piezoelectric layer. The substrate SU is made up in particular of lithium tantalate having a cut which is suitable for the SAW generation and propagation. For example, LT42 has a temperature coefficient of the elastic properties in the x-direction of approximately −40 ppm. To compensate for this, the compensation layer KS is arranged above the electrode layer EL1 in a suitable thickness which is measured in thickness corresponding to the desired degree of compensation.

Figure 2:
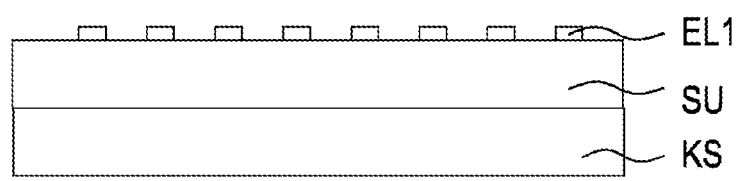

FIG. 2 shows a similar component in which, however, the compensation layer KS is applied to a surface of the substrate which is opposite the surface provided with the electrode layer. If the thickness of the piezoelectric layer is chosen to be suitably thin, good compensation for the temperature coefficient of the frequency may also be achieved via this arrangement.

Figure 3:
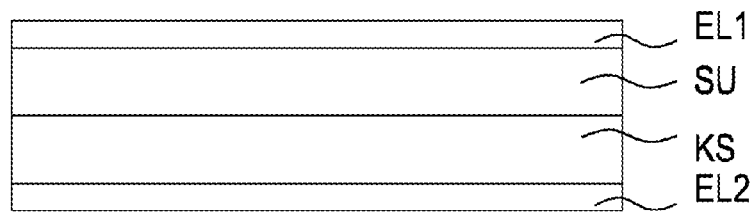
FIG. 3 shows a BAW component having a compensation layer.

FIG. 3 shows a component operating with bulk acoustic waves (BAW component), in which a compensation layer KS is applied directly to a piezoelectric substrate SU. A first electrode layer EL1 is arranged on the exposed surface of the substrate SU, and a second electrode layer EL2 is arranged on the exposed surface of the compensation layer KS. The thickness of the compensation layer KS and the substrate SU together determine the wavelength of the BAW component, so that a thicker compensation layer KS results in a thinner substrate at a given wavelength, in order to set the same resonance frequency in the BAW component.

Figure 4:
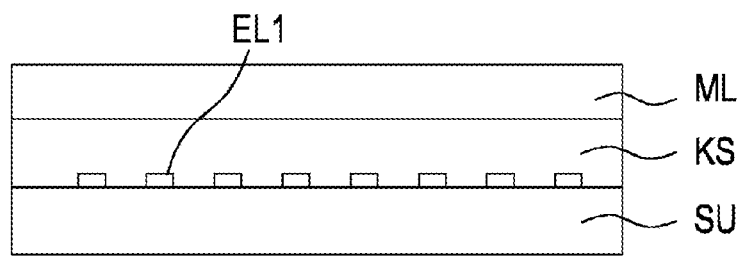
FIG. 4 shows a GBAW component having a compensation layer.

FIG. 4 shows an additional type of components operating with acoustic waves, i.e., a component operating with guided acoustic waves, a so-called GBAW component. In the case of this component, electrodes are again arranged in an in particular structured first electrode layer EL1 on a piezoelectric substrate SU. Thereover, the compensation layer KS is arranged in a desired layer thickness.

The completion of the component is formed by a cladding layer ML applied above the compensation layer KS, which has a higher velocity v(ML) of the acoustic wave than the compensation layer v(KS):

$$v(ML) > v(KS).$$

The velocity in turn may be correspondingly set according to $$v = \sqrt{(c/\rho)}$$

via the thickness ρ or the rigidity c of the materials used. It is thus ensured that the guidance of the acoustic wave takes place predominantly within the substrate and the compensation layer. In addition, the thickness of the cladding layer is set high enough that practically no acoustic motion or vibration is able to occur at the surface of the cladding layer pointing away from the piezo layer or pointing away from the compensation layer.

Figure 5:
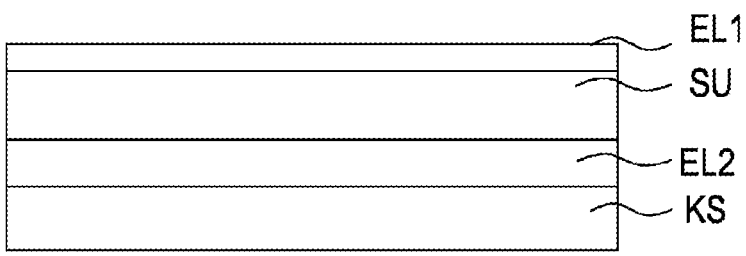
FIG. 5 shows an additional BAW component.

FIG. 5 shows a BAW component having a first electrode layer EL1, a piezoelectric layer SU, and a second electrode layer EL2, in which the compensation layer KS is applied on the outside to one of the two electrode layers EL1, EL2.

Of course, it is possible to arrange the compensation layer KS anywhere between the first electrode layer EL1 and the second electrode layer EL2. As another option, multiple compensation layers KS of different thickness may be used. BAW components having one or multiple such compensation layers may be formed as an SMR (solidly mounted resonator) resting directly on the substrate, or having a membrane design.

Figure 6:
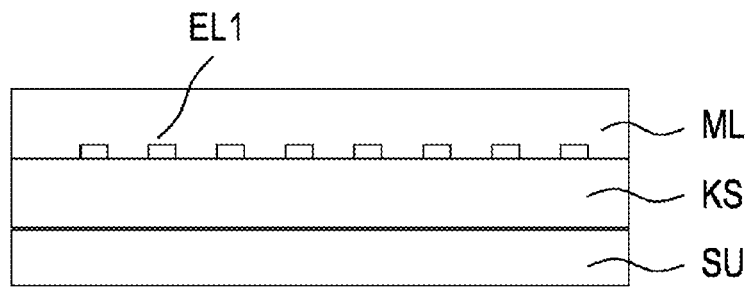
FIG. 6 shows an SAW component.

FIG. 6 shows an additional GBAW component, in which the compensation layer is arranged between the piezoelectric substrate and the first electrode layer EL1. A cladding layer ML may also be arranged above the electrode layer EL1, as depicted in FIG. 6.

FIGS. 7a and 7b show options of how the acoustic properties of an SAW component provided with a compensation layer KS may be improved further. The reduced reflectivity of the electrodes due to the low acoustic impedance difference between the electrodes and the compensation layer material is restored by means of an additional reflection created via structuring of the compensation layer KS. For this purpose, recesses (FIG. 7a) or bulges (FIG. 7b) are introduced into the surface of the compensation layer KS in parallel with the electrode fingers, which form reflection areas for the acoustic wave and are arranged in the same grid as the electrode fingers, and therefore amplify the reflectivity of the at the electrode fingers. In connection with the present invention, additional dielectric layers DS are also possible between the piezo crystal/piezo layer and the electrodes, or above the compensation layer. FIGS. 8a to 8c show such exemplary embodiments. Thus, in FIG. 8a, a dielectric layer DS is arranged between the first electrode layer EL1 and the compensation layer KS. In FIG. 8b, a dielectric layer DS is arranged above the cladding layer ML. FIG. 8c shows an embodiment which simultaneously has two dielectric layers DS1 and DS2, as are already depicted individually in FIGS. 8a and 8b.

FIG. 9 shows the profile of the modulus of elasticity as a function of the temperature in the system $Sc_{(1-x)}Y_xF_3$ for different parameters x corresponding to an yttrium component between 0 and 25%. It will be seen that for an yttrium content of 20% (x=0.2), the greatest increase in the modulus of elasticity results in the temperature range of 300 to 500 K, so that this material has the highest positive temperature coefficient of the modulus of elasticity and is best suited for use in a compensation layer in a component operating with acoustic waves. The pure scandium trifluoride demonstrates a negative thermal expansion coefficient, but only a temperature coefficient of the modulus of elasticity approaching zero.

From the diagram and the underlying experiments, a temperature coefficient of the center frequency of approximately 1500 ppm/K results for the mixed scandium-yttrium trifluoride having an yttrium component between 20 and 25%. On the other hand, fluorine-doped $SiO_2$ demonstrates a coefficient <700 ppm/K, while undoped $SiO_2$ demonstrates a temperature coefficient <300 ppm/K. In comparison to compensation layers commonly used today made up of undoped $SiO_2$, an improvement of the compensation by a factor of 5 thus results.

The material properties, in particular of the mixed scandium-yttrium trifluoride, for example, rigidity, lie within a range comparable to the $SiO_2$ layers which have been used to date. At a somewhat higher density than $SiO_2$, it may be expected that the other component properties are also not negatively affected by the new compensation layer. Since only a lower layer thickness of the compensation layer is required due to the improved compensation, in fact, a significant improvement in the acoustic properties may be expected.

The present invention is not limited to the embodiments described in detail in the exemplary embodiments, which only specify exemplary embodiments of components having a compensation layer which function by means of acoustic waves. In principle, components are also conceivable which have more than one compensation layer, or components which have other means for reducing the temperature coefficient of the center frequency, in particular, stress layers.

The invention claimed is:

1. A component operating with acoustic waves, having a layer of a piezoelectric material including at least one pair of electrodes for exciting acoustic waves in the piezoelectric material
    having a compensation layer arranged in the component in such a way that at least a portion of the energy of the acoustic wave is located in the compensation layer,
    wherein the compensation layer includes dielectric material based on a rare-earth compound made up of at least two elements, the dielectric material having a negative thermal expansion coefficient.

2. The component as claimed in claim 1, in which the compensation layer is applied directly to the layer of the piezoelectric material, wherein the electrodes are arranged on the piezoelectric layer, on the compensation layer, or between these two layers.

3. The component as claimed in claim 1, in which the rare-earth compound is in the form of scandium trifluoride $ScF_3$.

4. The component as claimed in claim 3, in which the rare-earth compound is in the form of $ScF_3$ doped with yttrium, having the formula $Sc_{(1-x)}Y_xF_3$, wherein the yttrium component expressed by the coefficient x is defined by the relationship $0<x\leq 0.25$.

5. The component as claimed in claim 4, in which the rare-earth compound is in the form of $ScF_3$ doped with yttrium having the formula $Sc_{(1-x)}Y_xF_3$, where x=0.2.

6. The component as claimed in claim 3, in which the compensation layer including $ScF_3$ is a glass.

7. The component as claimed in claim 1, in which the compensation layer includes a network former.

8. The component as claimed in claim 1, in which the compensation layer has a positive temperature coefficient of the thermoelastic properties greater than 700 ppm/K.

9. The component as claimed in claim 1,
    designed as an SAW component,
    including at least one interdigital transducer on or above the piezoelectric layer
    including a compensation layer deposited above the piezoelectric layer and the interdigital transducer, which contains $ScF_3$ in pure form, doped, in the form of a mixed crystal including other oxides or halides, or embedded in a crystalline matrix or a glass
    wherein the temperature coefficient of the center frequency is fully compensated for by a layer thickness of 5 to 20% relative to the wavelength at the center frequency of the component.

10. The component as claimed in claim 1,
    designed as an BAW component,
    including two electrode layers
    including a compensation layer deposited between the piezoelectric layer and an electrode layer or onto an electrode layer opposite to the piezoelectric layer, wherein the compensation layer contains $ScF_3$ in pure form, doped, in the form of a mixed crystal including other oxides or halides, or embedded in a crystalline matrix or a glass
    wherein the temperature coefficient of the center frequency is fully compensated for by a layer thickness of 5 to 20% relative to the wavelength at the center frequency of the component.

11. The component as claimed in claim 2, in which the rare-earth compound is in the form of scandium trifluoride $ScF_3$, in which the rare-earth compound is in the form of $ScF_3$ doped with yttrium, having the formula $Sc_{(1-x)}Y_xF_3$, wherein the yttrium component expressed by the coefficient x is defined by the relationship $0<x\leq 0.25$, or in which the rare-earth compound is in the form of $ScF_3$ doped with yttrium having the formula $Sc_{(1-x)}Y_xF_3$, where x=0.2.

12. The component as claimed in claim 11, in which the compensation layer includes a network former.

13. The component as claimed in claim 2, in which the compensation layer has a positive temperature coefficient of the thermoelastic properties greater than 700 ppm/K.

14. The component as claimed in claim 11, in which the compensation layer has a positive temperature coefficient of the thermoelastic properties greater than 700 ppm/K.

15. The component as claimed in claim 2,
    designed as an SAW component,
    including at least one interdigital transducer on or above the piezoelectric layer
    including a compensation layer deposited above the piezoelectric layer and the interdigital transducer, which contains $ScF_3$ in pure form, doped, in the form of a mixed crystal including other oxides or halides, or embedded in a crystalline matrix or a glass
    wherein the temperature coefficient of the center frequency is fully compensated for by a layer thickness of 5 to 20% relative to the wavelength at the center frequency of the component.

16. The component as claimed in claim 11,
designed as an SAW component,
including at least one interdigital transducer on or above the piezoelectric layer
including a compensation layer deposited above the piezoelectric layer and the interdigital transducer, which contains $ScF_3$ in pure form, doped, in the form of a mixed crystal including other oxides or halides, or embedded in a crystalline matrix or a glass
wherein the temperature coefficient of the center frequency is fully compensated for by a layer thickness of 5 to 20% relative to the wavelength at the center frequency of the component.

17. The component as claimed in claim 2,
designed as an BAW component,
including two electrode layers
including a compensation layer deposited between the piezoelectric layer and an electrode layer or onto an electrode layer opposite to the piezoelectric layer, wherein the compensation layer contains $ScF_3$ in pure form, doped, in the form of a mixed crystal including other oxides or halides, or embedded in a crystalline matrix or a glass
wherein the temperature coefficient of the center frequency is fully compensated for by a layer thickness of 5 to 20% relative to the wavelength at the center frequency of the component.

18. The component as claimed in claim 11,
designed as an BAW component,
including two electrode layers
including a compensation layer deposited between the piezoelectric layer and an electrode layer or onto an electrode layer opposite to the piezoelectric layer, wherein the compensation layer contains $ScF_3$ in pure form, doped, in the form of a mixed crystal including other oxides or halides, or embedded in a crystalline matrix or a glass
wherein the temperature coefficient of the center frequency is fully compensated for by a layer thickness of 5 to 20% relative to the wavelength at the center frequency of the component.

19. A component operating with acoustic waves,
having a layer of a piezoelectric material including at least one pair of electrodes for exciting acoustic waves in the piezoelectric material
having a compensation layer which is arranged in the component in such a way that at least a portion of the energy of the acoustic wave is located in the compensation layer, in which the compensation layer includes a dielectric material having a negative thermal expansion coefficient the material being chosen from one of the following compounds: $ZrW_2O_8$, $ZrMo_2O_8$, $HfW_2O_8$, $HfMo_2O_8$, $ScW_3O_{12}$, $AlW_3O_{12}$, $Zr(WO_4)(PO_4)_2$, $ScF_3$—$BaF_2$—$YF_3$, $ScF_3$—$BaF_2$—$ZnF_2$, $ScF_3$—$BaF_2$—$InF_3$, $ScF_3$—$MgF_2$, $YbF_3$—$ScF_3$, $LuF_3$—$ScF_3$, $Zn(CN)_2$, $BeF_2$, $B_2O_3$, and zeolite.

* * * * *